US009035343B2

(12) United States Patent
Zhang

(10) Patent No.: US 9,035,343 B2
(45) Date of Patent: May 19, 2015

(54) LIGHT EMITTING DEVICE PACKAGE

(71) Applicant: SAMSUNG ELECTRONICS CO., LTD., Suwon-si, Gyeonggi-do (KR)

(72) Inventor: Sung-Uk Zhang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/045,399

(22) Filed: Oct. 3, 2013

(65) Prior Publication Data

US 2014/0175487 A1    Jun. 26, 2014

(30) Foreign Application Priority Data

Dec. 26, 2012 (KR) .................. 10-2012-0153707

(51) Int. Cl.
H01L 33/00 (2010.01)
H01L 33/60 (2010.01)
H01L 33/54 (2010.01)

(52) U.S. Cl.
CPC ............... *H01L 33/60* (2013.01); *H01L 33/54* (2013.01); *H01L 2924/0002* (2013.01); *H01L 2224/48091* (2013.01); *H01L 2224/73265* (2013.01)

(58) Field of Classification Search
CPC ......... H01L 33/20; H01L 33/24; H01L 33/26; H01L 33/48; H01L 33/54; H01L 33/56; H01L 33/483; H01L 33/486
USPC .................................... 257/92–100
See application file for complete search history.

(56) References Cited

U.S. PATENT DOCUMENTS

| 6,924,513 | B2 * | 8/2005 | Akaike et al. ............... 257/98 |
| 7,015,117 | B2 | 3/2006 | Urbanek |
| 8,216,867 | B2 | 7/2012 | Donofrio et al. |
| 2004/0173810 | A1 * | 9/2004 | Lin et al. .................. 257/100 |
| 2010/0327295 | A1 | 12/2010 | Peng et al. |

FOREIGN PATENT DOCUMENTS

| JP | 2009-302241 A | 12/2009 |
| KR | 10-2005-0104151 A | 11/2005 |
| KR | 10-0954453 B1 | 4/2010 |
| KR | 10-0956106 B1 | 5/2010 |
| KR | 10-1108984 B1 | 1/2012 |
| KR | 10-2012-0038806 A | 4/2012 |

* cited by examiner

Primary Examiner — Brook Kebede
(74) Attorney, Agent, or Firm — McDermott Will & Emery LLP

(57) ABSTRACT

A light emitting device package is provided. The light emitting device includes: a substrate; a light emitting device disposed at one side of the substrate; and a formation layer formed on the substrate and having a slope at an edge portion of the formation layer.

20 Claims, 11 Drawing Sheets

LIGHT EMITTING DEVICE PACKAGE

CROSS-REFERENCE TO RELATED APPLICATIONS

This application claims the benefit of Korean Patent Application No. 10-2012-0153707, filed on Dec. 26, 2012, in the Korean Intellectual Property Office, the disclosure of which is incorporated herein in its entirety by reference.

TECHNICAL FIELD

This disclosure relates to a light emitting device package, and more particularly, to a light emitting device package capable of preventing a formation layer formed on a substrate from being delaminated from the substrate.

BACKGROUND

A light emitting diode (LED) refers to a kind of a semiconductor device including a light emitting source through PN formation of a compound semiconductor and realizing various colors of light. Such a light emitting device has a long lifecycle, a compact size, and a light weight. Moreover, due to its strong light directivity, a low-voltage operation is possible. In addition, such an LED is resistant to shock and vibration and does not require a preheating time or complex driving. Also, since such an LED is packaged in various forms, it may be applied for various purposes.

SUMMARY

The disclosure provides a light emitting device package capable of preventing a formation layer from being delaminated from a substrate by removing an edge portion of the formation layer where a thermal deformation phenomenon is concentrated.

According to an aspect of the disclosure, there is provided a light emitting device package including a substrate, a light emitting device disposed on one side of the substrate, and a formation layer disposed on the substrate and having a slope at an edge portion of the formation layer.

In certain embodiments, the slope may be slanted at a first angle relative to a side of the substrate. The first angle may be about 25° to about 70°.

In certain embodiments, the substrate may be a hexahedron having a top, a bottom, a first side, a second side, a third side, and a fourth side. the formation layer may be disposed on the top of the substrate. The slope may include a first slope extending along the first side and a second slope extending along the second side. The first slope may be formed slanted at a second angle relative to the first side of the substrate, and the second slope may be formed slanted at a third angle relative to the second side of the substrate.

The substrate may be a hexahedron having a top, a bottom, a first side, a second side, a third side, and a fourth side. The formation layer may be disposed on the top of the substrate, and the slope may be a corner slope formed on each of four corners of the substrate.

The substrate may be a hexahedron having a top, a bottom, a first side, a second side, a third side, and a fourth side. The formation layer may be disposed on the top of the substrate, and the slope may have a first slope extending along the first side, a second slope extending along the second side, and an edge slope formed on an edge of the substrate. In certain embodiments, the slope may be a concave slope having a section that is concave in a downward direction. In certain other embodiments, the slope may be a convex slope having a section that is convex in an upward direction.

The slope of the formation layer may extend into the substrate so that a portion of the substrate has a same slope as the formation layer. In another embodiment, the formation layer may have a side that is connected to the slope and extends to a side of the substrate along a same line as the side of the substrate.

The light emitting device may comprise a flip chip including a bump electrically connected to a pad formed on the substrate.

The light emitting device may include a wire electrically connected to a pad formed on the substrate.

The formation layer may include one of a reflective layer comprising a synthetic resin material containing at least a reflective material, a transparent sealing layer, a transparent lens layer, and combinations thereof.

According to another aspect of the disclosure, there is provided a light emitting device package including a substrate, a light emitting device disposed at a top of the substrate, and a reflective layer formed at a side of the light emitting device and the top of the substrate and having a slope at an edge portion of the reflective layer.

According to another aspect of the disclosure, a method of manufacturing a light emitting device package is provided. The method comprises forming a light emitting device on one side of a substrate and forming a formation layer on the substrate. A slope is formed at an edge portion of the formation layer.

In certain embodiments, forming the slope comprises forming a groove using a blade, a laser cutting device, or etching.

The method of forming the slope at an edge portion of the formation layer may comprise forming a first slope extending along a first side of the substrate and a second different slope at a second side of the substrate.

The method of forming the slope at an edge portion of the formation layer may comprise forming a corner slope at the corners of the substrate.

In certain embodiments, forming the slope comprises using a bevel blade to form a V-shaped groove, and using a vertical blade to form a vertical groove in the V-shaped groove.

BRIEF DESCRIPTION OF THE DRAWINGS

Exemplary embodiments of the disclosure will be more clearly understood from the following detailed description taken in conjunction with the accompanying drawings.

DETAILED DESCRIPTION

Figure 1:
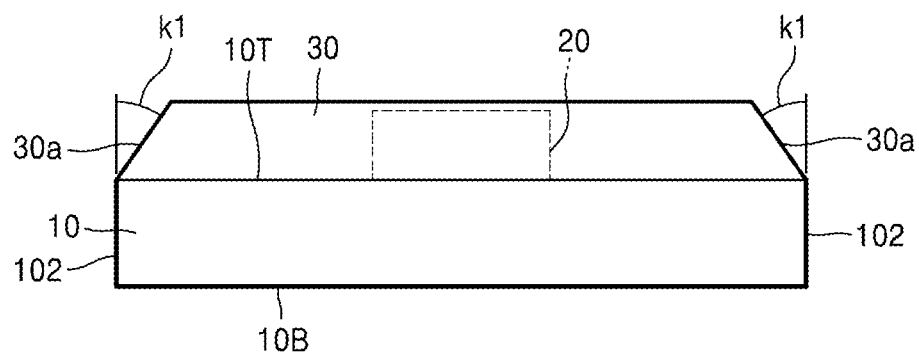
FIG. 1 is a cross-sectional view of a light emitting device package according to an embodiment of the disclosure.

Hereinafter, embodiments of the disclosure will be described in more detail with reference to the accompanying drawings.

The disclosure may, however, be embodied in many different forms and should not be construed as being limited to the embodiments set forth herein; rather, these embodiments are provided so that this disclosure will be thorough and complete, and will fully convey the concept of the disclosure to those of ordinary skill in the art. In addition, the sizes of elements and the relative sizes between elements may be exaggerated for further understanding of the present disclosure, and portions unrelated to the description are omitted.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing.

Figure 2:
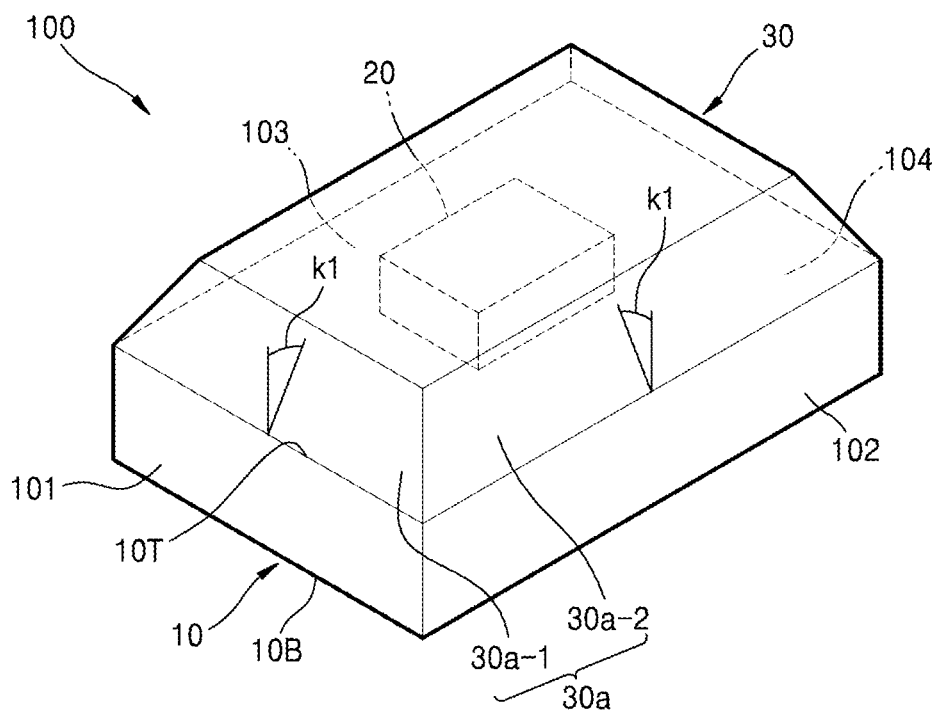
FIG. 2 is a perspective view of the light emitting device package of FIG. 1.
Figure 3:
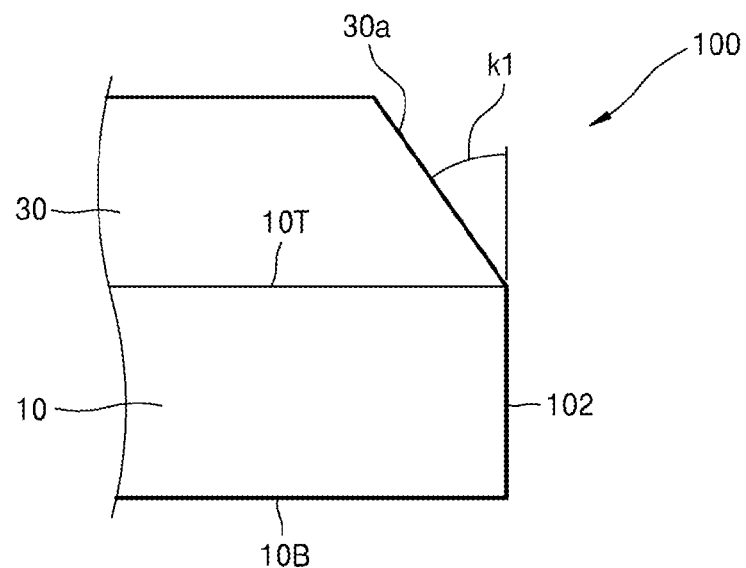
FIG. 3 is an enlarged view of a slope of the light emitting device package of FIG. 1.

FIG. 1 is a cross-sectional view of a light emitting device package 100 according to an embodiment of the present disclosure. FIG. 2 is a perspective view of the light emitting device package 100 of FIG. 1. FIG. 3 is an enlarged view of a slope 30a of FIG. 1.

First, as shown in FIGS. 1 to 3, the light emitting device package 100 may include a substrate 10, a light emitting device 20, and a formation layer 30. Here, the substrate 10 is where the light emitting device 20 is disposed, and may be formed of a material having an appropriate mechanical strength and insulating property to support the light emitting device 20.

For example, the substrate 10 may be a ceramic substrate in consideration of thermal conductivity. In addition, the substrate 10 may be a printed circuit board (PCB) where various wiring layers are formed to connect the light emitting device 20 to an external power and an epoxy resin sheet is formed as a multilayer. Moreover, the substrate 10 may be a synthetic resin substrate of resin, glass, or epoxy, or a metallic substrate of insulated aluminium, copper, zinc, tin, lead, gold, or silver, and also may have a plate form or a lead frame form.

Further, the light emitting device 20 is installed at one side of the substrate 10, and is formed of a semiconductor. For example, the light emitting device 20 may include a blue light-emitting LED of a nitride semiconductor or an ultraviolet light-emitting LED. The nitride semiconductor is expressed by a general formula of $Al_xGa_yIn_zN$ ($0 \leq x \leq 1$, $0 \leq y \leq 1$, $0 \leq z \leq 1$, $x+y+z=1$).

Moreover, the light emitting device 20 may be formed by epitaxially growing a nitride semiconductor of InN, AlN, InGaN, AlGaN, or InGaAlN on a substrate through a vapor deposition method such as a MOCVD method. Furthermore, besides the nitride semiconductor, the light emitting device 20 may be formed using a semiconductor of ZnO, ZnS, ZnSe, SiC, GaP, GaAlAs, or AlInGaP. The semiconductor may be a stacked layer structure obtained by sequentially forming an n-type semiconductor layer, a light emitting layer, and a p-type semiconductor layer. The light emitting layer (i.e., an active layer) may be formed of a stacked layer semiconductor having a multi-quantum well structure or a single quantum well structure or a stacked layer semiconductor having a double hetero structure. Additionally, the light emitting device 20 may emit light at an arbitrary wavelength.

Moreover, the formation layer 30 may be formed at another side of the substrate 10, and thus, may be formed on the slope 30a at an edge of the substrate 10.

Figure 16:
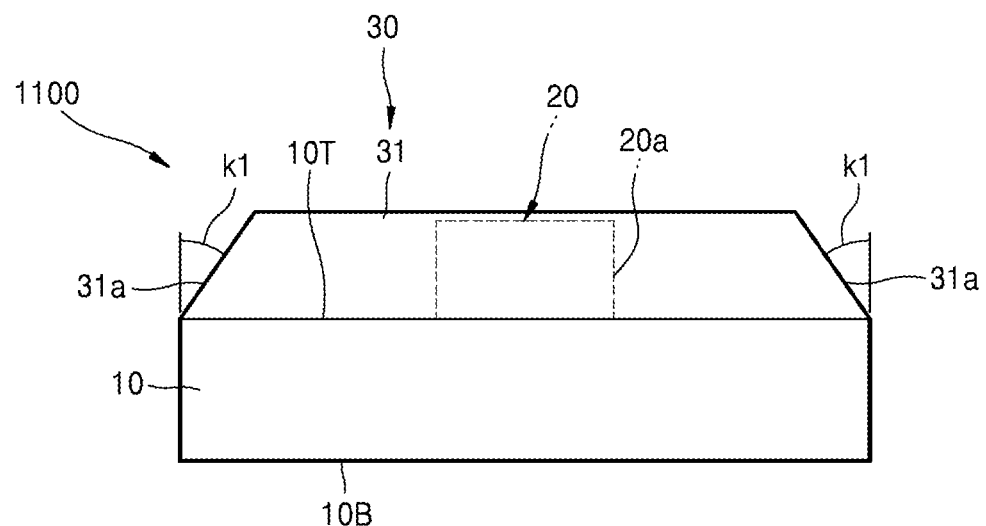
FIG. 16 is a cross-sectional view of a light emitting device package according to an embodiment of the present disclosure.
Figure 18:
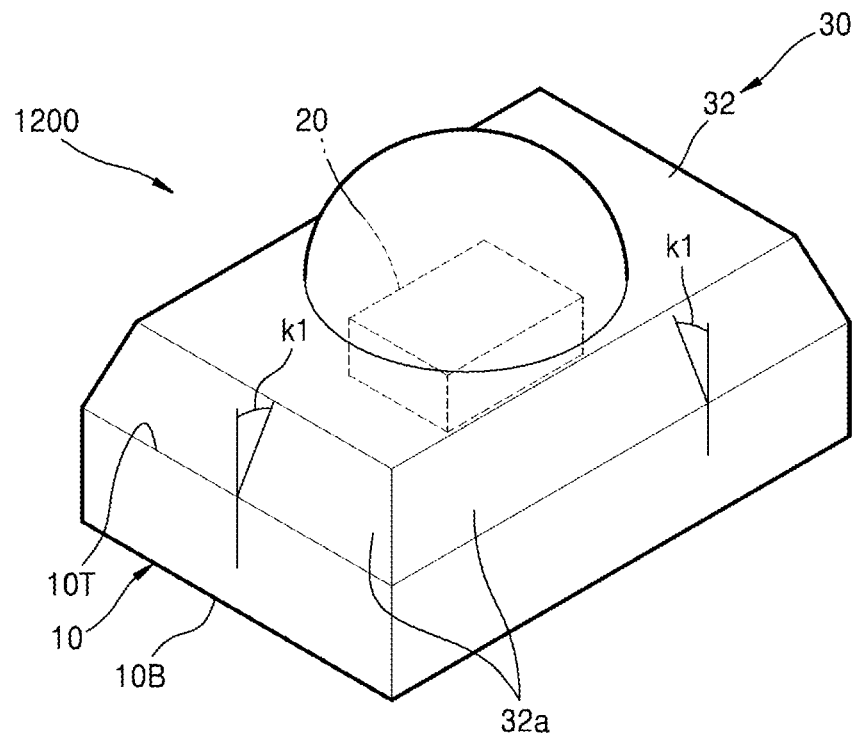
FIG. 18 is a perspective view of the light emitting device package of FIG. 17.

Here, the formation layer 30 may be a reflective layer 31 of FIG. 16, a transparent lens layer 32 of FIG. 18, or a transparent sealing layer. The reflective layer 31 may be formed of a material that reflects the light from the light emitting device 20. The material for forming the reflective layer 31 includes thermosetting resins or thermoplastic resins. In more detail, the material may include an epoxy resin composition, a silicon resin composition, a modified epoxy resin composition such as a silicone modified epoxy resin, a modified silicon resin composition such as an epoxy modified silicon resin, a polyimide resin composition, a modified polyimide resin composition, polyphthalimide amides (PPA), a polycarbonate resin, a polyphenylene sulfide (PPS), a liquid crystal polymer (LCP), and a resin such as an ABS resin, a phenolic resin, an acrylic resin, and a PBT resin. Additionally, the resin may contain a light reflective material such as titanium oxide, silicon dioxide, titanium dioxide, zirconium dioxide, titanium, potassium, alumina, aluminium nitride, boron nitride, and mullite. Moreover, a reflective film may be disposed on the reflective layer 31 in order to increase reflectivity. For example, the reflective film may be a single layer film or stacked layer film of a metal, such as gold, silver, platinum, nickel, titanium, and aluminium; or an inorganic compound such as, an oxide or nitride of the metal.

Additionally, the transparent lens layer 32, or the transparent sealing layer, may be formed of a material that transmits the light from the light emitting device 20 to the outside. The transparent lens layer 32, or the transparent sealing layer, may have a light transmittance from the light emitting device 20 of more than about 70% or about 90%. A material for forming the transparent lens layer 32, or the transparent sealing layer may be identical or different from a material for forming the reflective layer 31. The different material means the type and composition of a material is not the same.

The transparent sealing layer may include a transparent resin or glass having excellent durability such as an epoxy resin, a silicone resin, an acrylic resin, and a urea resin, as a transparent sealing resin.

Moreover, as shown in FIGS. 1 to 3, the slope 30a may be formed slanted at a first angle K1 relative to a side of the substrate 10. Here, the first angle K1 may be about 25° to about 70° in order to prevent the formation layer 30 from being delaminated from the substrate 10.

As shown in FIG. 2, in relation to the light emitting device package 100, the substrate 10 may be a hexahedron having a top 10T, a bottom 10B, a first side 101, a second side 102, a third side 103, and a fourth side 104. Here, the formation layer 30 is formed on the top 10T of the substrate 10, and the slope 30a may include a first slope 30a-1 extending along the first side 101 and a second slope 30a-2 extending along the second side 102. Additionally, as shown in FIGS. 2 and 3, the first slope 30a-1 and the second slope 30a-2 may be slanted at the first angle K1 relative to the first side 101 and the second side 102 of the substrate 10, respectively.

Figure 4:
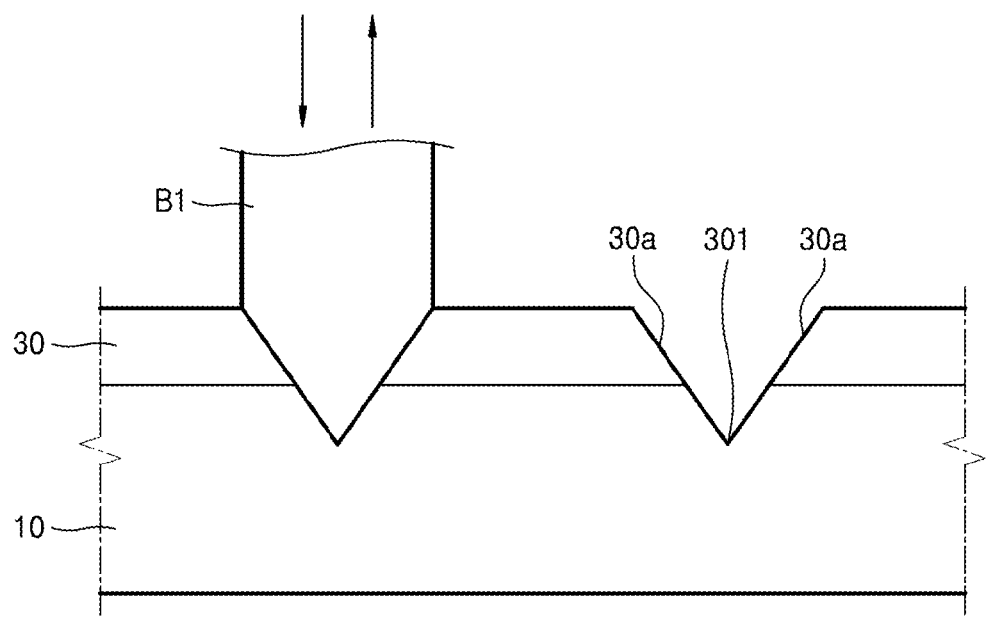
FIGS. 4 and 5 are cross-sectional views for explaining a method of manufacturing the light emitting device package of FIG. 1 according to an embodiment of the present disclosure.
Figure 5:
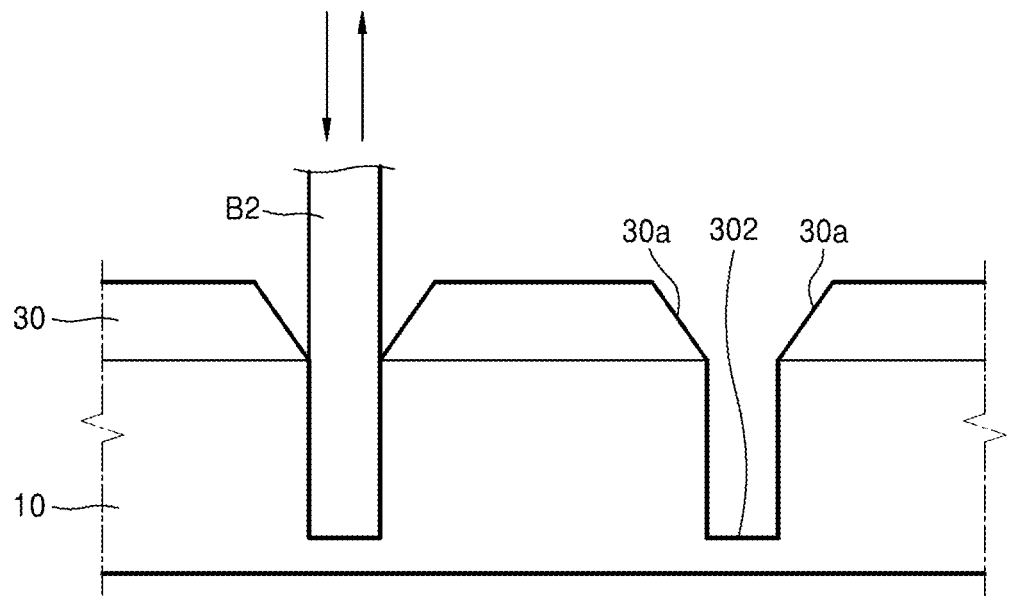
Figure 6:
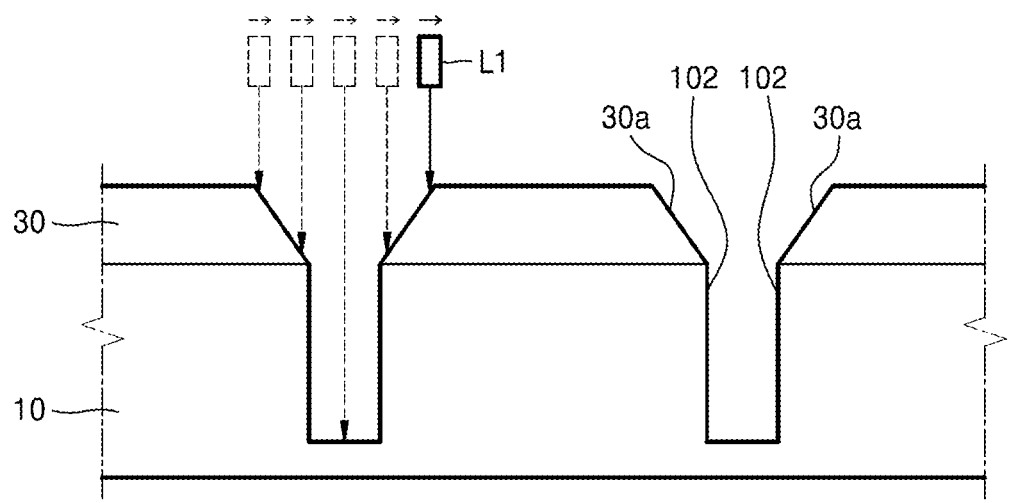
FIG. 6 is a cross-sectional view for explaining a method of manufacturing the light emitting device package of FIG. 1 according to another embodiment of the present disclosure.

FIGS. 4 and 5 are cross-sectional views for explaining a method of manufacturing the light emitting device package 100 of FIG. 1 according to an embodiment of the present disclosure. FIG. 6 is a cross-sectional view for explaining a method of manufacturing the light emitting device package 100 of FIG. 1 according to another embodiment of the present disclosure.

Various methods of manufacturing the light emitting device package 100 be performed. For example, as shown in FIG. 4, a V groove 301 including a slope 30a is formed on the formation layer 30 by using a bevel blade B1, and then, as shown in FIG. 5, a vertical groove 302 is formed in the V groove 301 including the side 102 of the substrate 10 by using a vertical blade B2. By forming the slope 30a on the formation layer 30 as a whole unit by using the bevel blade B1 and the vertical blade B2, a plurality of light emitting device packages 100 may be manufactured quickly.

Additionally, as shown in FIG. 6, a laser cutting device L1 can be used to sequentially and differently adjust the depth of cut, so that the slope 30a of the formation layer 30 and the side 102 of the substrate 10 may be cut quickly. In addition, the formation layer 30 can be etched by using an etchant to form the slope 30a.

Figure 7:
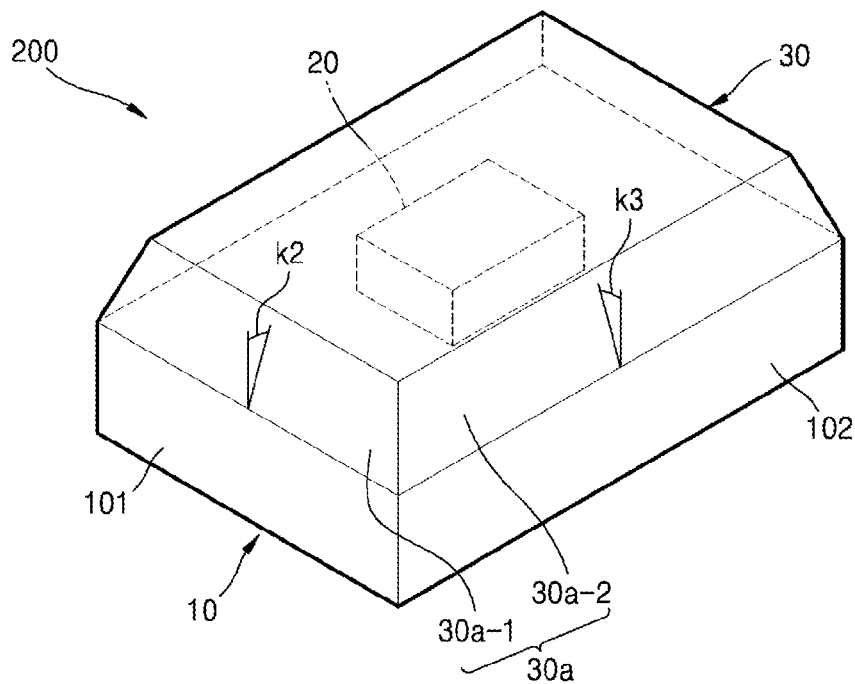
FIG. 7 is a perspective view of a light emitting device package according to an embodiment of the present disclosure.

FIG. 7 is a perspective view of a light emitting device package 200 according to an embodiment of the present disclosure. As shown in FIG. 7, a first slope 30a-1 of the light emitting device package 200 may be formed slanted at a second angle K2 relative to a first side 101 of a substrate 10, and a second slope 30a-2 of the light emitting device package 200 may be formed slanted at a third angle K3 relative to a second side 102 of the substrate 10.

For example, as shown in FIG. 7, when the first side 101 of the substrate 10 has a relatively short length and the second side 102 has a relatively long length, the second angle K2 of the first side 30a-1 with a relatively high probability of the displacement of the formation layer 30, is relatively large, and the third angle K3 of the second slope 30a-2 may be relatively small or zero.

Figure 8:
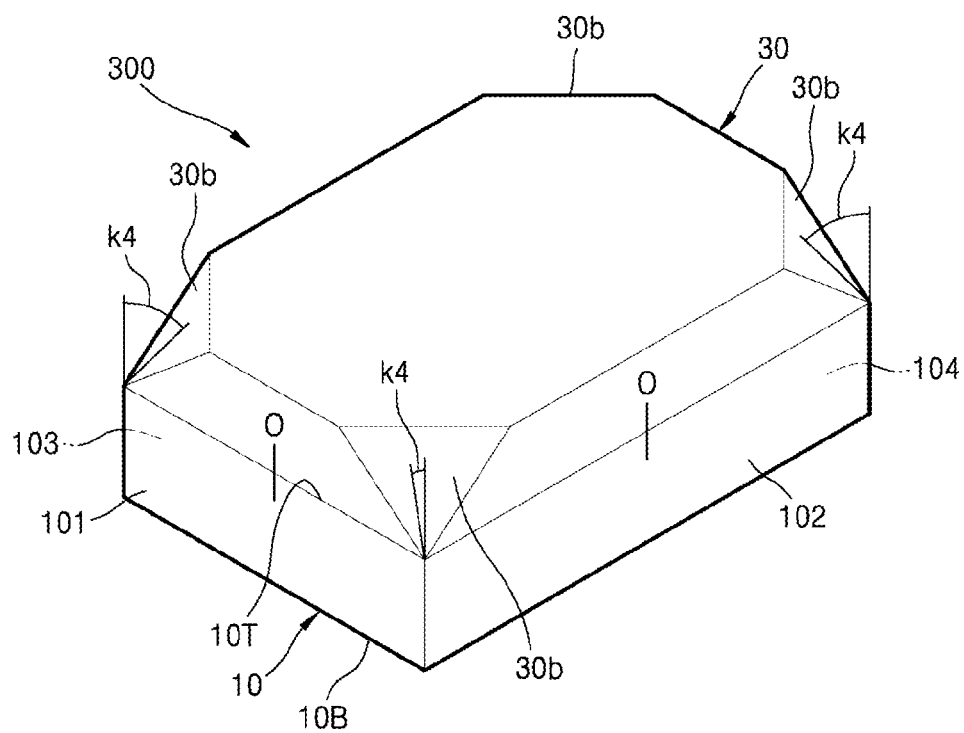
FIG. 8 is a perspective view of a light emitting device package according to an embodiment of the present disclosure.

FIG. 8 is a perspective view of a light emitting device package 300 according to an embodiment of the present disclosure. As shown in FIG. 8, a substrate 10 of the light emitting device package 300 may be a hexahedron having a top 10T, a bottom 10B, a first side 101, a second side 102, a third side 103, and a fourth side 104. The formation layer 30 is formed on the top 10T of the substrate 10. Slopes 30b may be corner slopes 30b formed at a corner slope angle K4 on the four corners of the substrate 10.

Accordingly, by forming the corner slopes 30b on the four corners of the substrate 10 with a relatively high probability of the displacement of the formation layer 30 to remove a corner edge portion where thermal deformation intensively occurs, a portion where the displacement of the formation layer 30 starts may be protected.

Figure 9:
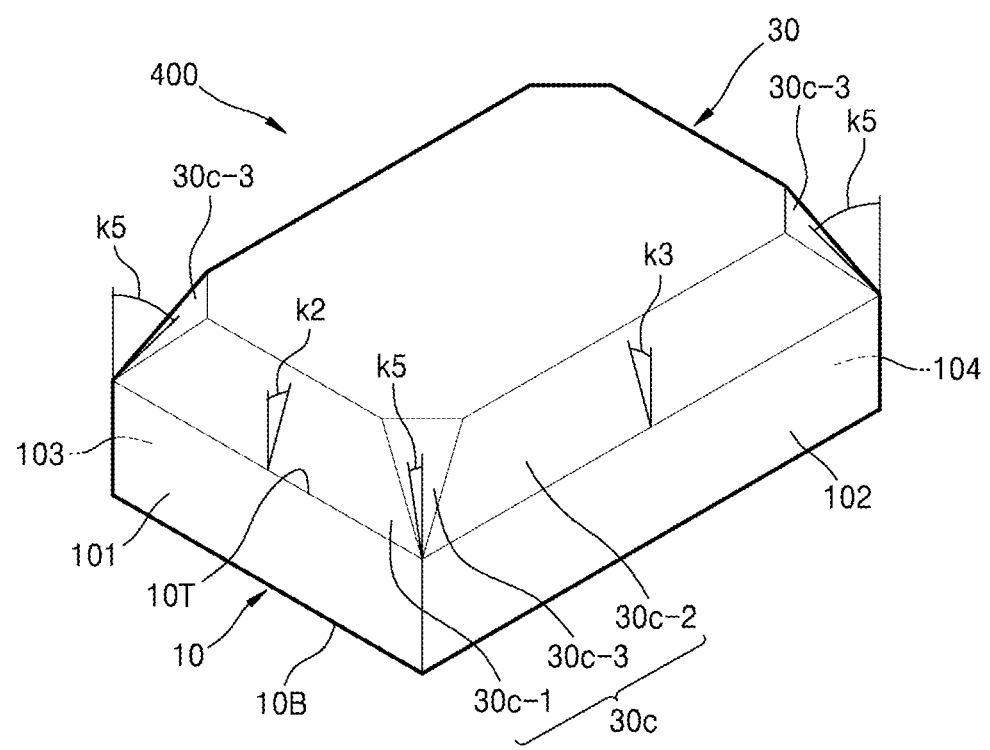
FIG. 9 is a perspective view of a light emitting device package according to an embodiment of the present disclosure.

FIG. 9 is a perspective view of a light emitting device package 400 according to an embodiment of the present disclosure. As shown in FIG. 9, a substrate 10 of the light emitting device package 400 may be a hexahedron having a top 10T, a bottom 10B, a first side 101, a second side 102, a third side 103, and a fourth side 104. The formation layer 30 is formed on the top 10T of the substrate 10. The slopes 30b may include a first slope 30c-1 elongated along the first side 101, a second slope 30c-2 elongated along the second side 102, and corner slopes 30c-3 formed at a corner slope angle K5 on the four corners of the substrate 10.

Accordingly, by forming the corner slopes 30c-3 on the four corners of the substrate 10 with a relatively high probability of the displacement of the formation layer 30 and additionally forming the first slope 30c-1 and the second slope 30c-2 to remove both a corner edge portion and a side edge portion where thermal deformation intensively occurs, a portion where the displacement of the formation layer 30 starts may be protected.

Figure 10:
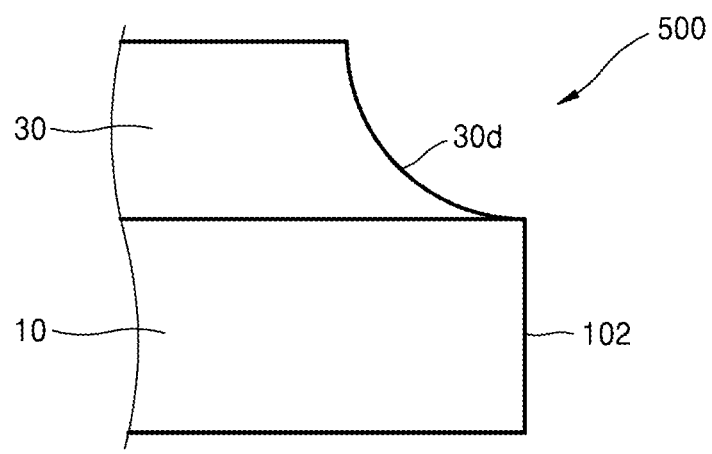
FIG. 10 is an enlarged cross-sectional view of a light emitting device package according to an embodiment of the present disclosure.

FIG. 10 is an enlarged cross-sectional view of a light emitting device package 500 according to an embodiment of the present disclosure. As shown in FIG. 10, a slope 30d of the light emitting device package 500 may be a concave slope 30d having a section that is concave in a downward direction.

Accordingly, by removing relatively more of an edge portion of the formation layer 30 with a high probability of thermal deformation, the displacement of the formation layer 30 may be prevented.

Figure 11:
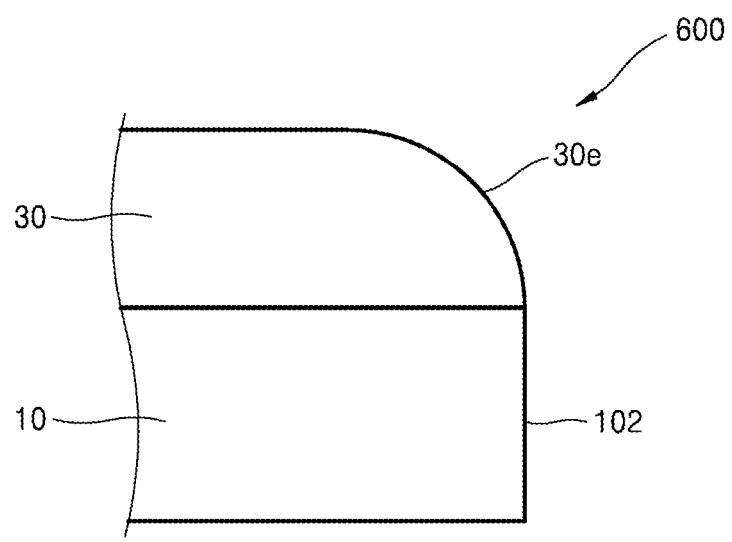
FIG. 11 is an enlarged cross-sectional view of a light emitting device package according to an embodiment of the present disclosure.

FIG. 11 is an enlarged cross-sectional view of a light emitting device package 600 according to an embodiment of the present disclosure. As shown in FIG. 11, a slope 30e of the light emitting device package 600 may be a convex slope 30e having a section that is convex in an upward direction.

Accordingly, by removing an edge portion of the formation layer 30 with a high probability of thermal deformation, the displacement of the formation layer 30 may be prevented, and by forming a convex round surface, mechanically strong durability with respect to an external shock may be provided.

Figure 12:
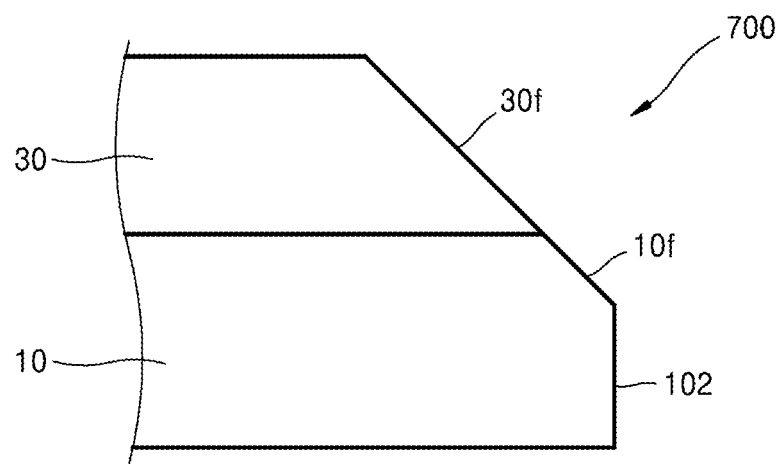
FIG. 12 is an enlarged cross-sectional view of a light emitting device package according to an embodiment of the present disclosure.

FIG. 12 is an enlarged cross-sectional view of a light emitting device package 700 according to an embodiment of the present disclosure. As shown in FIG. 12, in relation to the light emitting device package 700, an extended slope 10f may be formed that obliquely extends into the substrate at the same angle as the slope 30f of the formation layer 30.

Accordingly, as the bevel blade B1 of FIG. 4 cuts the formation layer 30, it also cuts the boundary part between the formation layer 30 and the substrate 10. Therefore, the displacement of the formation layer 30 may be suppressed by processing the vulnerable boundary part to be smoother.

Figure 13:
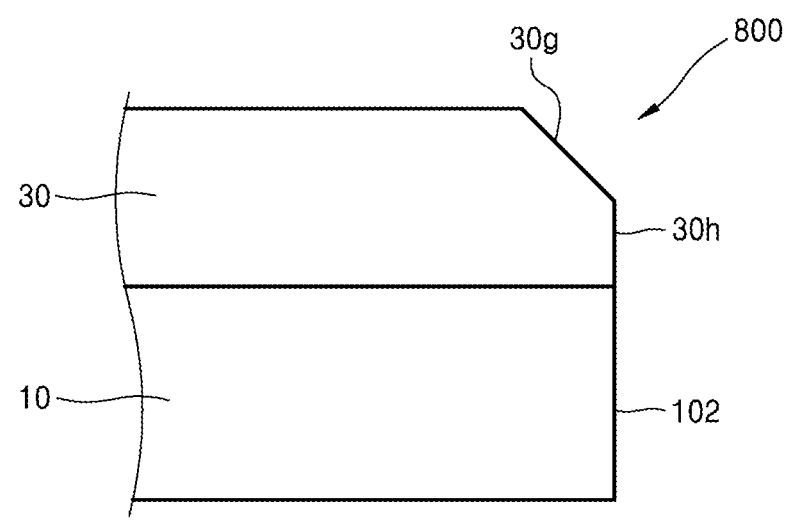
FIG. 13 is an enlarged cross-sectional view of a light emitting device package according to an embodiment of the present disclosure.

FIG. 13 is an enlarged cross-sectional view of a light emitting device package 800 according to an embodiment of the present disclosure. As shown in FIG. 13, in relation to the formation layer 30 of the light emitting device package 800, a side 30h of the formation layer 30 connected to a slope 30g and extending at the same angle as the side 102 of the substrate 10 may be formed at a lower part of the slope 30g.

Accordingly, as the vertical blade B2 of FIG. 5 cuts the boundary part between the formation layer 30 and the substrate 10 to process the vulnerable boundary part to be smoother, the displacement of the formation layer 30 may be suppressed.

Figure 14:
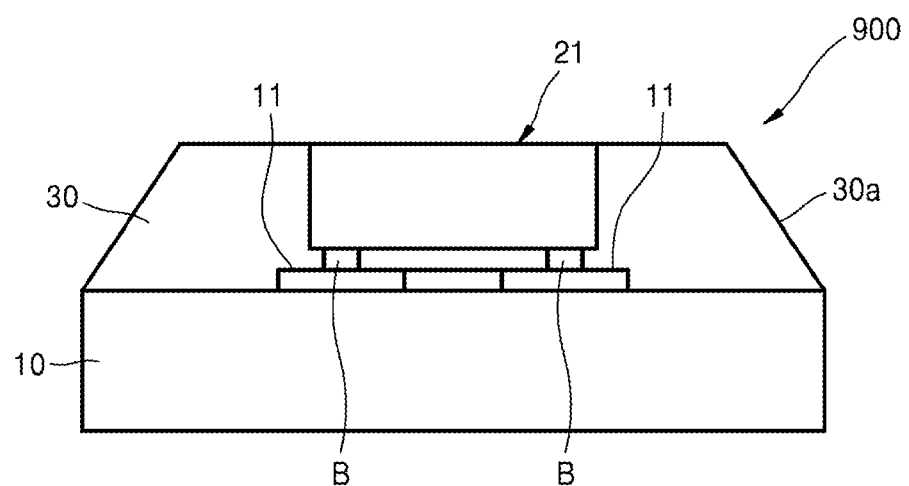
FIG. 14 is a cross-sectional view of a light emitting device package according to an embodiment of the present disclosure.

FIG. 14 is a cross-sectional view of a light emitting device package 900 according to an embodiment of the present disclosure. As shown in FIG. 14, the light emitting device 21 of the light emitting device package 900 may comprise a flip chip having a bump B electrically connected to a pad 11 formed on the substrate 10. Here, instead of the bump B, various signal delivery media such as a solder ball are possible. The bump B may be formed of gold (Au), silver (Ag), platinum (Pt), aluminium (Al), copper (Cu), or a solder material, and may be formed through processes such as various deposition processes, sputtering processes, plating processes such as pulse plating or direct current plating, soldering processes, and adhesion processes.

Figure 15:
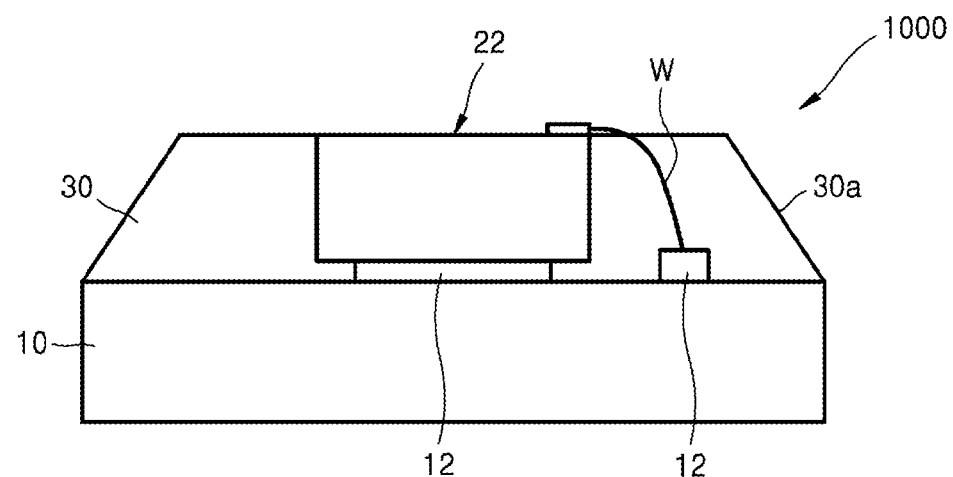
FIG. 15 is a cross-sectional view of a light emitting device package according to an embodiment of the present disclosure.

FIG. 15 is a cross-sectional view of a light emitting device package 1000 according to an embodiment of the present disclosure. As shown in FIG. 15, in relation to the light emitting device package 1000, the light emitting device 22 may be a vertical or parallel light emitting device 22 having a wire W electrically connected to a pad 12 formed on the substrate 10.

The wire W, as a wire for semiconductor device bonding, may be formed of Au, Ag, Pt, Al, Cu, Pd, Ni, Co, Cr, or Ti, and may be formed by a wire bonding device.

FIG. 16 is a cross-sectional view of a light emitting device package 1100 according to an embodiment of the present disclosure. As shown in FIG. 16, the formation layer 30 of the light emitting device package 1100 may be a reflective layer 31 comprising a synthetic resin material including a reflective material.

As mentioned above, the reflective layer 31 may be formed of a material that reflects the light from the light emitting device 20.

Additionally, the reflective layer 31 may be formed by containing a light reflective material such as titanium oxide, silicon dioxide, titanium dioxide, zirconium dioxide, titanium, potassium, alumina, aluminium nitride, boron nitride, and mullite in various synthetic resin materials such as an epoxy resin, a hardener, and an organic/inorganic filler, allowing it to flow in a fluid state on the substrate 10 and then, performing a hardening process. Alternatively, the reflective layer 31 may be formed through injection molding in a mold. For example, the reflective layer 31 may be formed of a polymer such as a resin, for example, an epoxy molding compound (EMC). However, the reflective layer 31 is not limited to the above-mentioned materials or methods. Additionally, the reflective layer 31 may be formed in a wide variety of forms in which an underfill member or a molded underfill member may be applicable.

Figure 17:
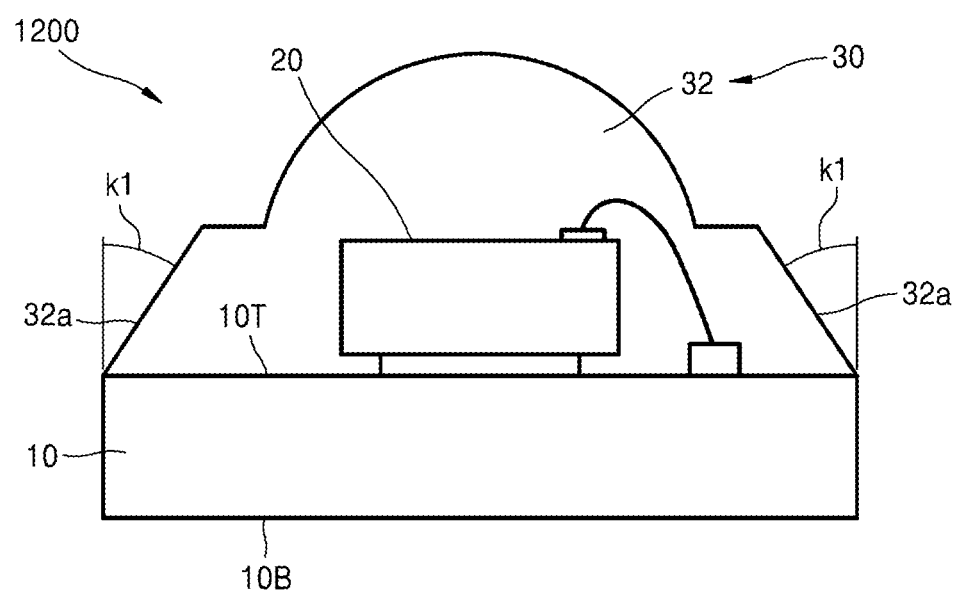
FIG. 17 is a cross-sectional view of a light emitting device package according to an embodiment of the present disclosure.

FIG. 17 is a cross-sectional view of a light emitting device package 1200 according to an embodiment of the present disclosure. FIG. 18 is a perspective view of the light emitting device package 1200 of FIG. 17. As shown in FIGS. 17 and 18, the formation layer 30 of the light emitting device package 1200 may be a transparent sealing layer and a transparent lens layer 32 of a synthetic resin material.

The transparent lens layer 32 may include a transparent resin or glass having excellent durability such as an epoxy resin, a silicone resin, an acrylic resin, and a urea resin, as a transparent sealing resin, and may be formed through injection molding in a mold. For example, the transparent lens layer 32 may be formed of a polymer such as a resin, for example, an EMC. However, the transparent lens layer 32 is not limited to the above-mentioned materials or methods. Additionally, the transparent lens layer 32 may be formed in a wide variety of forms in which an underfill member or a molded underfill member may be applicable.

Figure 19:
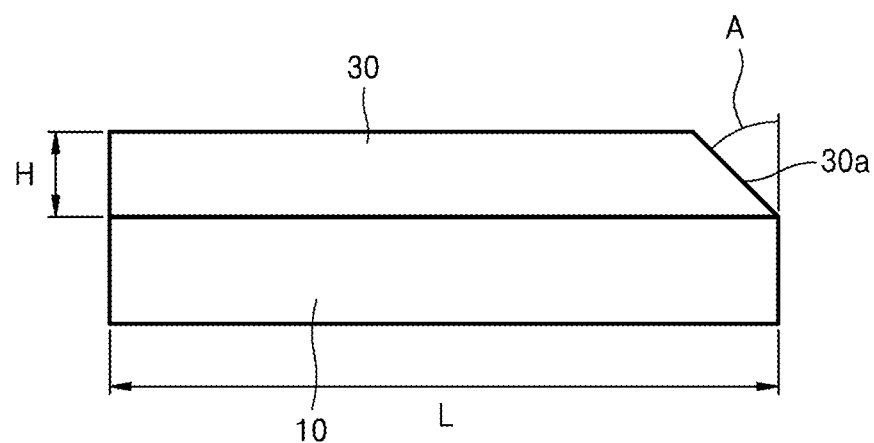
FIG. 19 is a cross-sectional view illustrating simulation numerical analysis of a light emitting device package according to an embodiment of the present disclosure.
Figure 20:
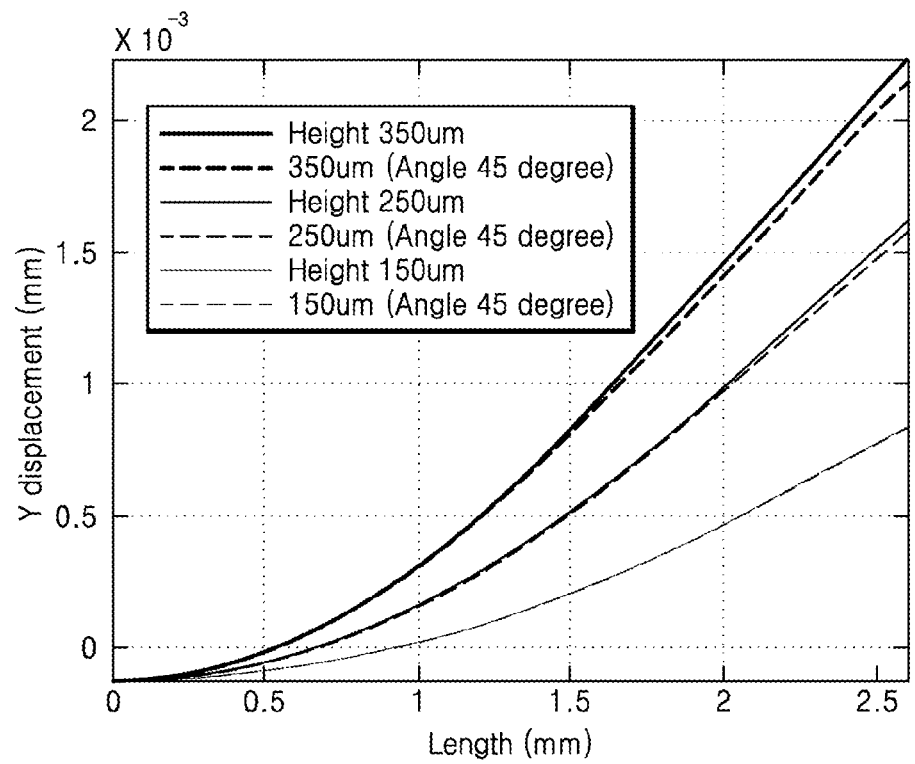
FIG. 20 is a graph obtained through simulation numerical analysis of displacement according to a height H of a formation layer under the conditions of FIG. 19.
Figure 21:
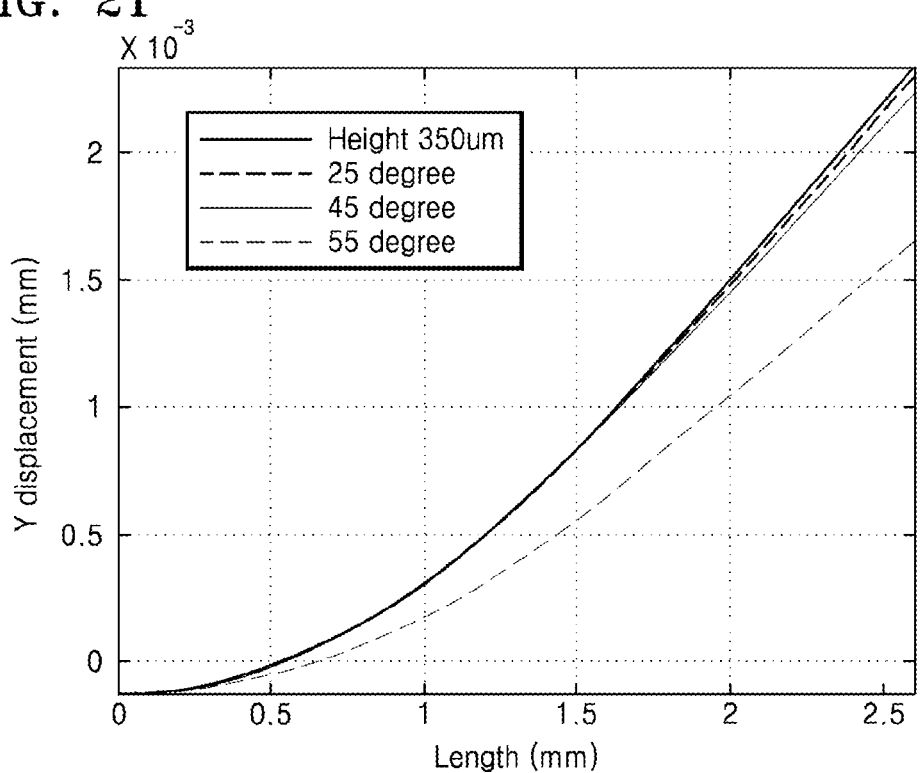
FIG. 21 is a graph obtained through simulation numerical analysis of displacement according to an angle A of a slope under the conditions of FIG. 19.

FIG. 19 is a cross-sectional view illustrating simulation numerical analysis of a light emitting device package according to an embodiment of the present disclosure. FIG. 20 is a graph obtained through numerical analysis simulation of displacement according to a height H of the formation layer 30 under the conditions of FIG. 19. FIG. 21 is a graph obtained through numerical analysis simulation of displacement according to an angle A of the slope 30a under the conditions of FIG. 19.

As shown in FIG. 20, an X axis represents the length L of the substrate 10 as "Length (mm)" When the height H of the formation layer 30 of FIG. 19 is 350 μm and there is no existing slope, this is indicated with "Height 350 μm" (a thick solid line). In comparison, when the slope angle A of FIG. 19 is 45° and the height H of the formation layer 30 is 350 μm, this is indicated with "350 μm (Angle 45 degree)" (a bold dotted line). According to a simulation numerical analysis result through a comparison of the displacements of a Y axis, it is confirmed in the case of the present disclosure that a Y axis value of a curve, i.e., the degree of a displacement phenomenon, becomes lower.

As shown with the thin solid lines and the thin dotted lines of FIG. 20, it is confirmed that as the height H is reduced to 250 μm and 150 μm at the same slope angle A of 45°, there is still an effect of preventing a displacement phenomenon, but as the height is reduced, the effect is also reduced.

Therefore, in relation to light emitting device packages according to several embodiments of the present disclosure, when the slope angle A of the slope 30a is uniform, as the height of the formation layer 30 becomes higher, the effect of preventing a displacement phenomenon becomes greater.

As shown in FIG. 21, an X axis represents the length L of the substrate 10 as "Length (mm)" When the height H of the formation layer 30 of FIG. 19 is 350 μm and there is no existing slope, this is indicated with "Height 350 μm" (a thick solid line). In comparison, the slope angle A of FIG. 19 is 25° is indicated with "25 degree" (a bold dotted line), the slope angle A of FIG. 19 is 45° is indicated with "45 degree" (a thin solid line), and the slope angle A of FIG. 19 is 55°, is indicated with "55 degree" (a thin dotted line). According to a numerical analysis simulation result through a comparison of the displacements of a Y axis, it is confirmed in the case of the present disclosure that a Y axis value of a curve, i.e., the degree of a displacement phenomenon, is reduced. Furthermore, as the slope angle A becomes larger, the effect of preventing a displacement phenomenon becomes greater. However, if the slope angle A is too large the area of the slope 30a becomes too broad and there are limitations in terms of mechanical processing. In certain embodiments, the angle A of the slope 30a may be about 25° to about 70°, in consideration of numeral interpretation and processing limitations.

Moreover, the light emitting device package 100 according to the present disclosure may be applied to a light emitting module having a plurality of combined light emitting device packages, or a lighting device or light emitting display having a plurality of such combined light emitting modules.

While the disclosure has been particularly shown and described with reference to exemplary embodiments thereof, it will be understood that various changes in form and details may be made therein without departing from the spirit and scope of the following claims.

What is claimed is:

1. A light emitting device package comprising:
 a substrate having a pair of opposing main surfaces and opposing side surfaces at the periphery of the substrate joining the pair of opposing main surfaces;
 a light emitting device disposed on one main surface of the substrate; and
 a formation layer disposed on the substrate and having a slope at an edge portion of the formation layer forming a sloped portion of the formation layer, wherein the sloped portion of the formation layer adjoins one of the side surfaces at the periphery of the substrate.

2. The light emitting device package of claim 1, wherein the slope is slanted at a first angle relative to a side face of the substrate.

3. The light emitting device package of claim 2, wherein the first angle is about 25° to about 70°.

4. The light emitting device package of claim 1, wherein
 the substrate is a hexahedron having a top, a bottom, a first side, a second side, a third side, and a fourth side;
 the formation layer is formed on the top of the substrate; and
 the slope includes a first slope extending along the first side and a second slope extending along the second side.

5. The light emitting device package of claim 4, wherein
 the first slope is slanted at a second angle relative to the first side of the substrate; and
 the second slope is slanted at a third angle relative to the second side of the substrate, wherein slopes of the second angle and the third angle are different.

6. The light emitting device package of claim 1, wherein
 the substrate is a hexahedron having a top, a bottom, a first side, a second side, a third side, and a fourth side;
 the formation layer is disposed on the top of the substrate; and
 the slope is a corner slope on each of four corners of the substrate.

7. The light emitting device package of claim 1, wherein
 the substrate is a hexahedron having a top, a bottom, a first side, a second side, a third side, and a fourth side;
 the formation layer is disposed on the top of the substrate; and
 the slope includes a first slope extending along the first side, a second slope extending along the second side, and an edge slope disposed on an edge of the substrate.

8. The light emitting device package of claim 1, wherein the slope is a concave slope having a section that is concave in a downward direction.

9. The light emitting device package of claim 1, wherein the slope is a convex slope having a section that is convex in an upward direction.

10. The light emitting device package of claim 1, wherein the slope of the formation layer extends into the substrate so that a portion of the substrate has a same slope as the formation layer.

11. The light emitting device package of claim 1, wherein the formation layer has a side that is connected to the slope and extends into a side of the substrate along a same line as the side of the substrate.

12. The light emitting device package of claim 1, wherein the light emitting device comprises a flip chip including a bump electrically connected to a pad formed on the substrate.

13. The light emitting device package of claim 1, wherein the light emitting device includes a wire electrically connected to a pad formed on the substrate.

14. The light emitting device package of claim 1, wherein the formation layer comprises one of a reflective layer of a synthetic resin material containing at least a reflective material, a transparent sealing layer, a transparent lens layer, and combinations thereof.

15. A light emitting device package comprising:
 a substrate having a pair of opposing main surfaces and opposing side surfaces at the periphery of the substrate joining the pair of opposing main surfaces;
 a light emitting device disposed on a main surface of the substrate; and
 a reflective layer formed at a side of the light emitting device and the top of the substrate and having a slope at an edge portion of the reflective layer forming a sloped portion of the reflective layer, wherein the sloped portion of the reflective layer adjoins one of the side surfaces at the periphery of the substrate.

16. A method of manufacturing a light emitting device package comprising:

forming a light emitting device on a main surface of a substrate having a pair of opposing main surfaces and opposing side surfaces at the periphery of the substrate joining the pair of opposing main surfaces;

forming a formation layer on the substrate; and forming a slope at an edge portion of the formation layer forming a sloped portion of the formation layer, wherein the sloped portion of the formation layer adjoins one of the side surfaces at the periphery of the substrate.

17. The method according to claim 16, wherein forming the slope comprises forming a groove using a blade, a laser cutting device, or etching.

18. The method according to claim 16, wherein forming the slope at an edge portion of the formation layer comprises forming a first slope extending along a first side of the substrate and a second different slope at a second side of the substrate.

19. The method according to claim 16, wherein forming the slope at an edge portion of the formation layer comprises forming a corner slope at the corners of the substrate.

20. The method according to claim 16, wherein forming the slope comprises:

using a bevel blade to form a V-shaped groove; and using a vertical blade to form a vertical groove in the V-shaped groove.

* * * * *